(12) United States Patent
Sadoughi et al.

(10) Patent No.: US 8,653,844 B2
(45) Date of Patent: Feb. 18, 2014

(54) CALIBRATING DEVICE PERFORMANCE WITHIN AN INTEGRATED CIRCUIT

(75) Inventors: Sharmin Sadoughi, Menlo Park, CA (US); Jae-Gyung Ahn, Pleasanton, CA (US)

(73) Assignee: Xilinx, Inc., San Jose, CA (US)

( * ) Notice: Subject to any disclaimer, the term of this patent is extended or adjusted under 35 U.S.C. 154(b) by 518 days.

(21) Appl. No.: 13/042,122

(22) Filed: Mar. 7, 2011

(65) Prior Publication Data

US 2012/0229203 A1 Sep. 13, 2012

(51) Int. Cl.
*G01R 31/3187* (2006.01)

(52) U.S. Cl.
USPC .................................................. 324/750.3

(58) Field of Classification Search
USPC .............. 324/762.01–762.1, 750.01–750.3; 257/48; 438/14–18
See application file for complete search history.

(56) References Cited

U.S. PATENT DOCUMENTS

| | | |
|---|---|---|
| 1,899,176 A | 2/1933 | Bailey |
| 3,593,319 A | 7/1971 | Barber |
| 4,156,249 A | 5/1979 | Koo |
| 4,249,196 A | 2/1981 | Durney et al. |
| 4,409,608 A | 10/1983 | Yoder |
| 4,427,457 A | 1/1984 | Carlson et al. |
| 4,470,096 A | 9/1984 | Guertin |
| 4,470,099 A | 9/1984 | Sawairi |
| 4,571,543 A | 2/1986 | Raymond et al. |
| 4,639,686 A | 1/1987 | Beckenbach et al. |
| 4,700,457 A | 10/1987 | Matsukawa |
| 4,731,696 A | 3/1988 | Himes et al. |
| 4,827,323 A | 5/1989 | Tigelaar et al. |
| 4,831,431 A | 5/1989 | Hanlon |
| 4,878,151 A | 10/1989 | Gallichio |
| 4,914,546 A | 4/1990 | Alter |
| 4,937,649 A | 6/1990 | Shiba et al. |
| 4,994,688 A | 2/1991 | Horiguchi et al. |
| 5,005,103 A | 4/1991 | Kwon et al. |
| 5,021,920 A | 6/1991 | Smith |
| 5,077,225 A | 12/1991 | Lee |
| 5,083,184 A | 1/1992 | Eguchi |

(Continued)

FOREIGN PATENT DOCUMENTS

| | | |
|---|---|---|
| DE | 25 48 563 A1 | 5/1977 |
| DE | 100 46 910 A1 | 10/2001 |

(Continued)

OTHER PUBLICATIONS

Bersuker, G. et al., Mechanism of Electron Trapping and Characteristics of Traps in HfO$_2$ Gate Stacks, IEEE Transactions on Device and Materials Reliability, vol. 7, No. 1, Mar. 2007, pp. 138-145.

(Continued)

*Primary Examiner* — Tung X Nguyen
(74) *Attorney, Agent, or Firm* — Kevin T. Cuenot

(57) ABSTRACT

A multi-fingered device can be calibrated for performance. The multi-fingered device can include a first finger configured to remain active and a second finger that is initially deactivated concurrent with the first finger being active. A measure of degradation for the multi-fingered device within an IC can be determined. The measure of degradation can be compared with a degradation threshold. Responsive to determining that the measure of degradation meets the degradation threshold, a finger of the multi-fingered device can be activated.

18 Claims, 4 Drawing Sheets

(56) References Cited

U.S. PATENT DOCUMENTS

| | | |
|---|---|---|
| 5,089,878 A | 2/1992 | Lee |
| 5,117,114 A | 5/1992 | Street et al. |
| 5,119,169 A | 6/1992 | Kozono et al. |
| 5,142,639 A | 8/1992 | Kohyama et al. |
| 5,155,658 A | 10/1992 | Inam et al. |
| 5,166,858 A | 11/1992 | Frake et al. |
| 5,172,299 A | 12/1992 | Yamada et al. |
| 5,177,410 A | 1/1993 | Hashiguchi et al. |
| 5,189,594 A | 2/1993 | Hoshiba |
| 5,208,725 A | 5/1993 | Akcasu |
| 5,275,974 A | 1/1994 | Ellul et al. |
| 5,583,359 A | 12/1996 | Ng et al. |
| 5,712,813 A | 1/1998 | Zhang |
| 5,868,388 A | 2/1999 | Wood et al. |
| 5,939,766 A | 8/1999 | Stolmeijer et al. |
| 6,037,621 A | 3/2000 | Wilson |
| 6,064,108 A | 5/2000 | Martinez |
| 6,066,537 A | 5/2000 | Poh |
| 6,297,524 B1 | 10/2001 | Vathulya et al. |
| 6,303,456 B1 | 10/2001 | Pricer et al. |
| 6,303,457 B1 | 10/2001 | Christensen et al. |
| 6,383,858 B1 | 5/2002 | Gupta et al. |
| 6,385,033 B1 | 5/2002 | Javanifard et al. |
| 6,410,954 B1 | 6/2002 | Sowlati et al. |
| 6,417,556 B1 | 7/2002 | Long et al. |
| 6,542,351 B1 | 4/2003 | Kwang |
| 6,570,210 B1 | 5/2003 | Sowlati et al. |
| 6,597,562 B1 | 7/2003 | Hu et al. |
| 6,625,006 B1 | 9/2003 | Aram et al. |
| 6,653,681 B2 | 11/2003 | Appel |
| 6,661,079 B1 | 12/2003 | Bikulcius |
| 6,690,570 B2 | 2/2004 | Hajimiri et al. |
| 6,737,698 B1 | 5/2004 | Paul et al. |
| 6,747,307 B1 | 6/2004 | Vathulya et al. |
| 6,765,778 B1 | 7/2004 | Du et al. |
| 6,819,542 B2 | 11/2004 | Tsai et al. |
| 6,822,312 B2 | 11/2004 | Sowlati et al. |
| 6,880,134 B2 | 4/2005 | Drennan |
| 6,882,015 B2 | 4/2005 | Bernstein et al. |
| 6,897,505 B2 | 5/2005 | Aton |
| 6,903,918 B1 | 6/2005 | Brennan |
| 6,927,125 B2 | 8/2005 | Jones et al. |
| 6,933,551 B1 | 8/2005 | Stribley et al. |
| 6,933,869 B1 | 8/2005 | Starr et al. |
| 6,949,781 B2 | 9/2005 | Chang et al. |
| 6,963,122 B1 | 11/2005 | Soenen et al. |
| 6,972,463 B2 | 12/2005 | Cheng |
| 6,974,744 B1 | 12/2005 | Aram et al. |
| 7,009,832 B1 | 3/2006 | Chen et al. |
| 7,013,436 B1 | 3/2006 | Morton et al. |
| 7,027,287 B2 | 4/2006 | Georgakos |
| 7,038,296 B2 | 5/2006 | Laws |
| 7,050,290 B2 | 5/2006 | Tang et al. |
| 7,116,544 B1 | 10/2006 | Sutardja |
| 7,154,734 B2 | 12/2006 | Schultz et al. |
| 7,161,228 B1 | 1/2007 | Pettit |
| 7,170,178 B2 | 1/2007 | Bely et al. |
| 7,193,263 B2 | 3/2007 | Barth |
| 7,195,971 B2 | 3/2007 | Bernstein et al. |
| 7,202,548 B2 | 4/2007 | Lee |
| 7,205,854 B2* | 4/2007 | Liu ................................ 331/57 |
| 7,259,945 B2 | 8/2007 | Cleveland |
| 7,259,956 B2 | 8/2007 | Fong et al. |
| 7,271,465 B2 | 9/2007 | Jessie et al. |
| 7,274,085 B1 | 9/2007 | Hsu et al. |
| 7,298,001 B1 | 11/2007 | Liu |
| 7,348,624 B2 | 3/2008 | Sakaguchi et al. |
| 7,394,274 B2* | 7/2008 | Muniandy et al. ......... 324/750.3 |
| 7,485,914 B2 | 2/2009 | Huang et al. |
| 7,564,264 B1 | 7/2009 | Morrison et al. |
| 7,663,233 B2 | 2/2010 | Lim |
| 7,768,054 B2 | 8/2010 | Benetik |
| 7,944,732 B2 | 5/2011 | de Jong et al. |
| 7,956,438 B2 | 6/2011 | Quinn |
| 7,994,609 B2 | 8/2011 | Quinn |
| 7,994,610 B1 | 8/2011 | Quinn |
| 8,207,592 B2 | 6/2012 | Quinn |
| 8,362,589 B2 | 1/2013 | Quinn |
| 2003/0183884 A1 | 10/2003 | Miyazawa |
| 2005/0077581 A1 | 4/2005 | Chang et al. |
| 2005/0135042 A1 | 6/2005 | Chiu-Kit Fong et al. |
| 2005/0161725 A1 | 7/2005 | Da Dalt |
| 2006/0203424 A1 | 9/2006 | Chen et al. |
| 2007/0096720 A1 | 5/2007 | Clements et al. |
| 2007/0181973 A1 | 8/2007 | Hung et al. |
| 2007/0190760 A1 | 8/2007 | Coolbaugh et al. |
| 2007/0278551 A1 | 12/2007 | Anthony |
| 2007/0296013 A1 | 12/2007 | Chang et al. |
| 2008/0239619 A1 | 10/2008 | Okamoto et al. |
| 2009/0057826 A1 | 3/2009 | Kim et al. |
| 2010/0125989 A1 | 5/2010 | Huang et al. |
| 2010/0127348 A1 | 5/2010 | Quinn |
| 2010/0127349 A1 | 5/2010 | Quinn |
| 2012/0229203 A1 | 9/2012 | Sadoughi et al. |

FOREIGN PATENT DOCUMENTS

| | | |
|---|---|---|
| DE | 10145 462 A1 | 4/2003 |
| GB | 1 149 569 | 4/1969 |
| GB | 1 469 944 A | 4/1977 |
| JP | 57-106804 | 7/1982 |
| JP | 58-051552 | 3/1983 |
| JP | 59-91718 | 6/1984 |
| JP | 61-259560 A | 11/1986 |
| JP | 61-263251 A | 11/1986 |
| JP | 63-070550 | 3/1988 |
| JP | 01084616 A | 3/1989 |
| JP | 01096943 A | 4/1989 |
| JP | 01-313917 | 12/1989 |
| JP | 02231755 A | 9/1990 |
| JP | 02-268439 | 11/1990 |
| JP | 02-307275 | 12/1990 |
| JP | 03-008360 | 1/1991 |
| JP | 03-071612 | 3/1991 |
| JP | 04-268756 | 9/1992 |
| JP | 07-283076 | 10/1995 |
| WO | WO 03/090280 | 10/2003 |

OTHER PUBLICATIONS

Keane, J. et al., "An On-Chip NBTI Sensor for Measuring pMOS Threshold Voltage Degradation", IEEE Transactions on Very Large Scale Integration (VLSI) Systems, 1-10, 2009.

PCT/US2012/025975 International Search Report, Section "C", Documents considered to be relevant, p. 3.

U.S. Appl. No. 13/229,207, filed Sep. 9, 2011, Wu, Zhaoyin D. et al., Xilinx, Inc. 2100 Logic Drive, San Jose, CA USA.

Amintoosi et al., "Using pattern matching for tiling and packing problems" European Journal of Operational Research, Amsterdam, NL, vol. 83, No. 3, Jul. 10, 2007, pp. 950-960.

Aparicio and Hajimiri, "Capacity Limits and Matching Properties of Integrated Capacitors", IEEE J. Solid-State circuits, vol. 37, No. 3, Mar. 2002, pp. 384-393.

Chan et al., "Analysis of MMIC Structures Using an Efficient Iterative Approach", IEEE Transactions on Microwave Theory and Techniques, vol. 36, No. 1, Jan. 1988, pp. 96-105.

Fukuda, H. et al., "Enumeration of Polyominoes, Polyiamonds and Polyhexes for Isohedral Tilings with Rotational Symmetry", Jun. 11, 2007, Computational Geometry and Graph Theory, Springer Berlin Heidelberg, Berlin Heidelberg, pp. 68-78.

Imamura et al., "Bending-Comb capacitor with a Small Parasitic Inductance", 2002 Symposium on VLSI Circuits Digest of Technical Papers, IEEE 2002, Jun. 13-15, 2002, pp. 22-25.

Jacobsen, Jesper, Lykke "Tetromino tilings and the Tutte polynomial", Journal of Physics A: Mathematical and Theoretical, vol. 40, No. 7, Feb. 16, 2007, pp. 1439-1446.

Rajagopalan et al., "Optimization of Metal-Metal Comb-Capacitors for RF Applications", Wireless Design & Development, Mar. 4, 2001, pp. 1-4.

Rhoads et al., "Planar tilings by polyominoes, polyhexes and polyiamonds", Journal of Computational and Applied Mathematics, Amsterdam, NL, vol. 174, No. 2, Feb. 15, 2005, pp. 329-353.

(56) References Cited

OTHER PUBLICATIONS

Samavati, H. et al., "Fractal Capacitor", IEEE Journal of Solid-State Circuit, vol. 33, No. 12, Dec. 1998, pp. 2035-2041.

Sowlati et al., "High Density Capacitance Structures in Submicron CMOS for Low Power RF Applications", International Symposium on Low Power Electronics and Design, 2001, Aug. 6-7, 2001, pp. 243-246.

Wakayama et al., "A 30-MHz Low-Jitter High-Linearity CMOS Voltage-Controlled Oscillator", IEEE Journal of Solid-State Circuits, vol. sc-22, No. 6, Dec. 1987, pp. 1074-1081.

* cited by examiner

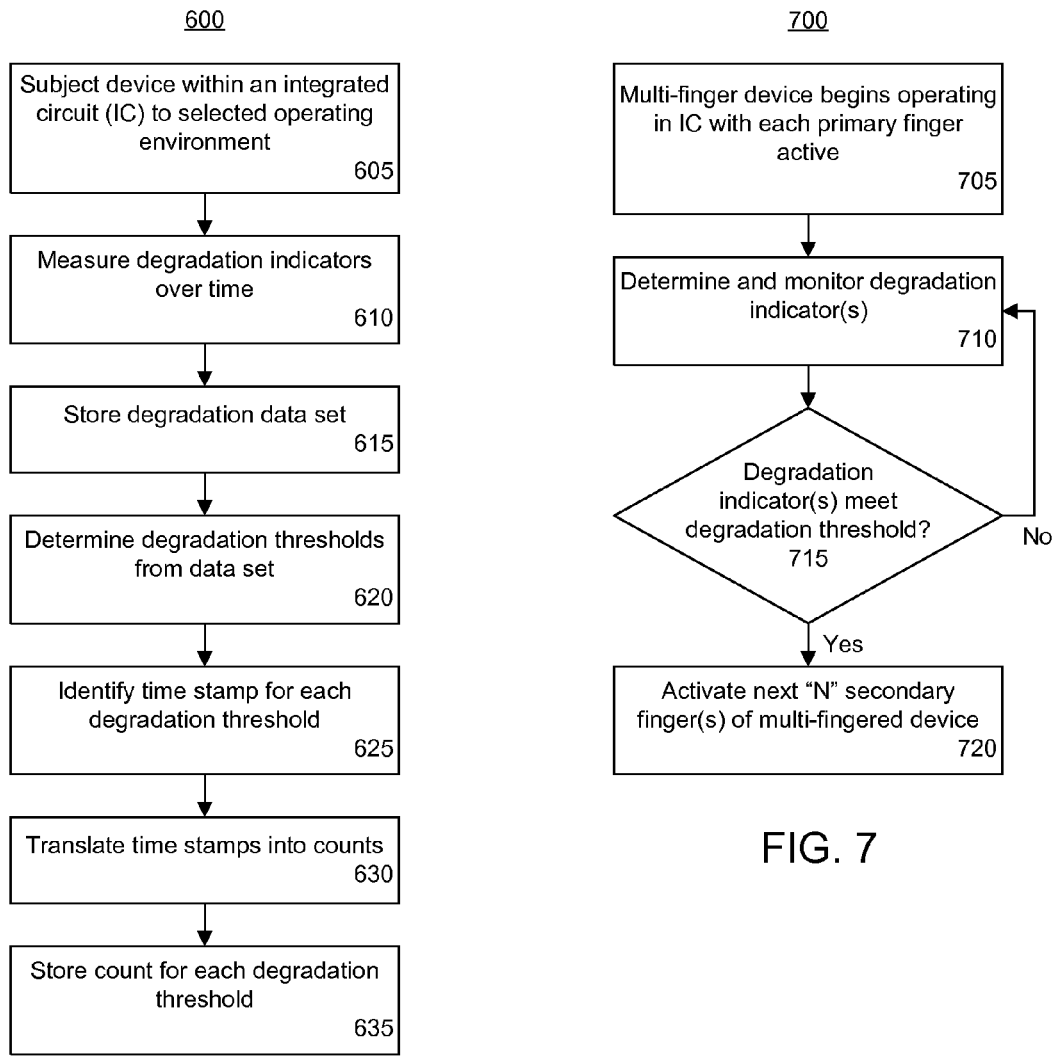

CALIBRATING DEVICE PERFORMANCE WITHIN AN INTEGRATED CIRCUIT

FIELD OF THE INVENTION

One or more embodiments disclosed within this specification relate to integrated circuits (ICs). More particularly, one or more embodiments relate to calibrating performance of a device that includes multiple fingers within an IC.

BACKGROUND

Designing reliable circuits has become increasingly complex particularly in view of aggressively scaled complementary metal-oxide-semiconductor (CMOS) technologies. For example, modern IC manufacturing processes capable of producing small devices increase the potential for interface traps in P-type metal-oxide-semiconductor (PMOS) devices during prolonged times of negative bias stress. An interface trap is created when a negative voltage is applied to the gate of a PMOS device for a prolonged time. The interface trap is located near the Si-oxide/Si-crystal lattice boundary where holes, i.e., positive charge, can get stuck, thereby causing a shift in the threshold voltage of the PMOS device. Hole trapping creates interface states as well as fixed charges. Both are positive charges and result in a negative shift of threshold voltage. This phenomenon is called PMOS Negative Bias Temperature Instability (NBTI). NBTI affects PMOS devices more so than N-type metal-oxide-semiconductor (NMOS) devices. A phenomenon called Positive BTI (PBTI), however, affects NMOS devices.

In view of trends to reduce device size and voltage margins in modern IC designs, phenomenon such as BTI, in reference to NBTI and/or PBTI, can be a significant factor in limiting the lifetime of CMOS devices. Other phenomena such as hot-carrier injection (HCI) can combine with BTI to reduce the lifetime of CMOS devices to an even greater extent. Because of the phenomena noted, circuit designers must over design devices to offset the degradation that occurs over the lifetime of a device. Circuit designers create devices within the IC that have operational characteristics that, for example, may be different or higher than the operational characteristics required by the circuit specification.

When a device is overdesigned, the operational characteristics of the device such as power usage, area usage, performance, or the like, can vary markedly from established target characteristics of the device as specified in the circuit specification. As a result, the device can be less than optimized, if not unsuitable, for the intended purpose of the device. Apart from the device being unsuited for an intended purpose, over-design also can add cost to a circuit design, particularly when applied across the many devices that are within modern ICs.

SUMMARY

One or more embodiments disclosed within this specification relate to integrated circuits (ICs) and, more particularly, to calibrating performance of a device that includes multiple fingers within an IC.

An embodiment can include a method of calibrating performance of a multi-fingered device within an IC. The method can include determining a measure of degradation for the multi-fingered device within the IC and comparing the measure of degradation with a degradation threshold. Responsive to determining that the measure of degradation meets the degradation threshold, a finger of the multi-fingered device can be activated.

Another embodiment can include a multi-fingered device configured for implementation within an integrated circuit. The multi-fingered device can include a first finger configured to remain active and a second finger that is initially deactivated concurrent with the first finger being active. The second finger can be configured for activation during operation of the integrated circuit.

Another embodiment can include a system configured for implementation within an integrated circuit. The system can include a multi-fingered device including a first finger configured to remain active and a second finger initially configured to be inactive concurrent with the first finger being active. The system can include a switch coupled to a gate of the second finger. The switch can be configured to activate the second finger by coupling a gate of the second finger to a signal also coupled to a gate of the first finger and deactivate the second finger by decoupling the gate of the second finger from the signal. The system also can include a finger activation circuit configured to instruct the switch to activate the second finger responsive to detecting a minimum amount of degradation in the device.

BRIEF DESCRIPTION OF THE DRAWINGS

FIG. 6 is a first flow chart illustrating a method of collecting calibration data for a device within an IC in accordance with another embodiment disclosed within this specification.

FIG. 7 is a second flow chart illustrating a method of calibrating a multi-fingered device in accordance with another embodiment disclosed within this specification.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to calibrating performance of a device that includes multiple fingers within an IC. A multi-fingered device can be controlled to selectively activate one or more of the fingers of the device over time. The activation of fingers previously not activated within the multi-fingered device can counteract the effects of degradation of the device that occur over time, e.g., over the lifetime of the multi-fingered device.

For example, when the multi-fingered device degrades a first amount, one or more inactive fingers can be activated, thereby restoring the multi-fingered device to, or near, pre-degradation operating condition. Over time, as the multi-fingered device continues to degrade, e.g., by a second amount, one or more other inactive fingers can be activated. By activating additional fingers of the multi-fingered device over time, the amount by which the multi-fingered device must be overdesigned within the context of the circuit design can be reduced. In consequence, the device is better suited for an intended function.

The one or more embodiments disclosed within this specification can be applied to one or more devices within an IC. For example, one or more devices of a circuit design can be selected as being of high importance or critical to the functionality of the circuit design within the IC within which the device is to be implemented. For example, a high importance device can be one that is implemented within, or as part of, a current mode logic buffer. In any case, those devices identified as being of high importance or critical within a circuit design can be calibrated so as to control degradation of the device over time.

Figure 1:
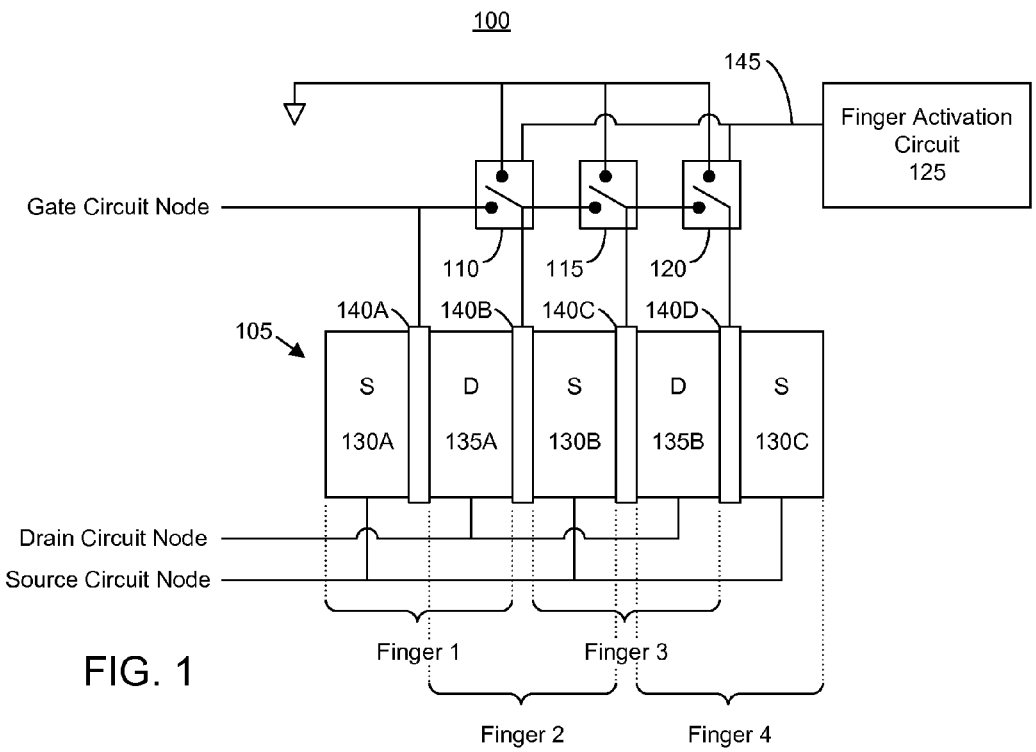
FIG. 1 is a first block diagram illustrating a system for calibrating a multi-fingered device in accordance with an embodiment disclosed within this specification.

FIG. 1 is a first block diagram illustrating a system 100 for calibrating a multi-fingered device in accordance with an embodiment disclosed within this specification. As shown, system 100 can include a multi-fingered device 105, a plurality of switches 110, 115, and 120, and a finger activation circuit 125. In an embodiment, multi-fingered device 105 can be a multi-fingered transistor.

Multi-fingered device 105 is characterized by the inclusion of multiple fingers. In general, the term "fingers" refers to a number of gates or gate regions contained within a particular metal-oxide-semiconductor field effect transistor (MOSFET) device. As shown, multi-fingered device 105 includes a plurality of gate regions 140A-140D, a plurality of source regions 130A-130C, and a plurality of drain regions 135A-135B. For purposes of illustration, surrounding well and substrate regions are not illustrated.

Each of source regions 130A-130C can be coupled in parallel to a node of a circuit (not shown) denoted as the source circuit node in FIG. 1. Source regions 130A-130C can couple to the source circuit node via metal wires that couple to one or more contacts (not shown) on each one of source regions 130A-130C. Similarly, each of drain regions 135A-135B can be coupled in parallel to a node of the circuit denoted as the drain circuit node. Drain regions 135A-135B can couple to the drain circuit node via metal wires that couple to one or more contacts (not shown) on each one of drain regions 135A-135B.

For purposes of illustration, multi-fingered device 105 includes four fingers. The fingers of multi-fingered device 105 can be numbered sequentially 1-4 for reference. Finger 1 can include gate region 140, source 130A and drain 135A. Finger 2 can include gate 140B, drain 135A, and source 130B. Finger 3 can include gate 140C, source 130B, and drain 135B. Finger 4 can include gate 140D, drain 135B, and source 130C.

Finger 1 can be referred to as a primary finger since finger 1 remains coupled to the gate circuit node. In the example shown in FIG. 1, no switch is used to selectively couple gate region 140A of finger 1 to the gate circuit node. It should be appreciated, however, that the exclusion of a switch is for purposes of illustration. In an embodiment, an additional switch can be included to selectively couple gate region 140A to the gate circuit node as will be described with respect to gate regions 140B-140D.

Each of fingers 2-4 can be referred to as a secondary finger since each is initially deactivated while finger 1 is initially active. Each of fingers 2-4 can be selectively activated through switches 110-120 respectively. Each of switches 110-120 can be implemented as any of a variety of different switching circuits ranging from single transistor switches to more complex switches including a plurality of components and/or transistors.

Finger activation circuit 125 can control the opening and closing of each of switches 110-120 independently via control signal 145, thereby activating or deactivating each of fingers 2-4. The particular conditions for activating fingers 2-4 will be described in greater detail within this specification. Initially, multi-fingered device 105 can begin operation with each of switches 110-120 being open. Accordingly, finger 1 is active, while fingers 2-4 are deactivated. In this state, finger 1, e.g., gate region 140A, is coupled to the gate circuit node while gates 140B-140D are not coupled to the gate circuit node.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Switches 110-120 are shown as being in an open state where gate regions 140B-14D, respectively, are not coupled to the gate circuit node or to ground. In an embodiment, when a finger is deactivated, the gate of that finger can be coupled to a supply voltage of the IC. In this example, since multi-fingered device 105 is an N-type metal-oxide-semiconductor (NMOS) device, the gate region of each deactivated finger can be coupled to ground, e.g., the low or lowest voltage supply of the IC, when the corresponding switch is open. It should be appreciated that were multi-fingered device 105 to be illustrated as a P-type metal-oxide-semiconductor (PMOS) device, the gate region of each deactivated finger would be coupled to the high voltage supply of the IC when the corresponding switch is open.

Over time, as multi-fingered device 105 suffers from degradation, one or more or all of fingers 2-4 can be activated. Responsive to determining that a sufficient amount of degradation has occurred within multi-fingered device 105, finger activation circuit 125 can activate one or more or all of fingers 2-4. For example, initially, at a time T1, only finger 1 is active and gate region 140 is coupled to the gate circuit node. At the start of operation of the IC and device 105, e.g., at time T1, no degradation has occurred.

At a time T2, finger activation circuit 125 can determine that multi-fingered device 105 has suffered degradation, e.g., a first minimum amount of degradation. Responsive to determining that multi-fingered device 105 has suffered a first minimum amount of degradation, finger activation circuit 125, through control signal 145, can instruct switch 110 to close. When switch 110 closes at time T2, gate region 140B is coupled to the gate circuit node and finger 2 is activated. It should be appreciated that at time T2, switch 110 also decouples gate region 140B from ground. With both fingers 1 and 2 being active, the first minimum amount of degradation of multi-fingered device 105 can be overcome. For example, an indicator of degradation of multi-fingered device 105, e.g., any indicators used to determine the measure of degradation, can be returned at or about a reference level for the indicator that existed at time T1, e.g., prior to the occurrence of degradation.

At a time T3, finger activation circuit 125 can determine that multi-fingered device 105 has suffered further degradation, e.g., a second minimum amount of degradation. Responsive to determining that multi-fingered device 105 has suffered a second minimum amount of degradation, finger activation circuit 125, through control signal 145, can instruct switch 115 to close. When switch 115 closes at time T3, gate region 140C is coupled to the gate circuit node and finger 3 is activated. At time T3, for example, switch 115 also decouples gate region 140C from ground. With fingers 1-3 being active, the degradation that has occurred after time T2 within multi-fingered device 105, e.g., the second minimum amount of degradation, can be overcome. Again, the indicator of degradation of multi-fingered device 105 can be returned at or about a reference level for the indicator that existed at time T1.

At a time T4, finger activation circuit 125 can determine that multi-fingered device 105 has suffered even further degradation, e.g., a third minimum amount of degradation. Responsive to determining that multi-fingered device 105 has suffered a third minimum amount of degradation, finger activation circuit 125, through control signal 145, can instruct switch 120 to close. When switch 120 closes at time T4, gate region 140D is coupled to the gate circuit node and finger 4 is activated. At time T4, for example, switch 120 also decouples gate region 140D from ground. With fingers 1-4 being active, the amount of degradation that has occurred after time T3 within multi-fingered device 105, e.g., the third minimum amount of degradation, can be overcome.

In an embodiment, the first, second, and third minimum amounts of degradation can be equivalent. In another embodiment, one or more or all of the first, second, and third minimum amounts of degradation can be different amounts. The first, second, and third minimum amounts of degradation, for example, can be linear or non-linear with respect to one another, e.g., when plotted or graphed. Finger activation circuit 125 can be configured to detect same or different amounts of degradations at various points of time during the lifetime of multi-fingered device 105.

Figure 2:
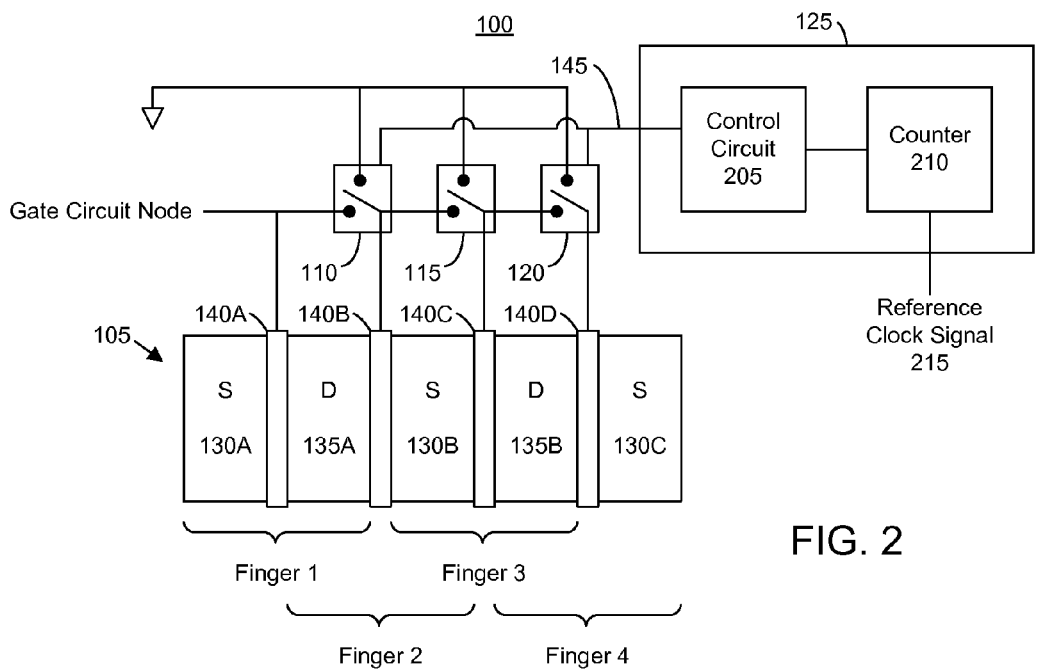
FIG. 2 is a second block diagram illustrating the system of FIG. 1 in accordance with another embodiment disclosed within this specification.

FIG. 2 is a second block diagram illustrating the system of FIG. 1 in accordance with another embodiment disclosed within this specification. FIG. 2 illustrates an embodiment in which the passage of time is measured and used to determine when inactive fingers of a multi-fingered device are to be activated. For purposes of clarity and ease of illustration, the source circuit node, the drain circuit node, and the wires coupling multi-fingered device 105 to the source and drain circuit nodes are not shown. Thus, FIG. 2 illustrates multi-fingered device 105, switches 110-120, and finger activation circuit 125. Finger activation circuit 125 includes a control circuit 205 and a counter 210. Like numbers will be used to refer to the same items throughout this specification to the extent necessary or possible.

FIG. 2 illustrates an embodiment in which degradation data for a device can be collected a priori and used to determine when to activate fingers of the device when the device is operational and in the field. For example, one or more operational parameters of a device can be selected as indicators of degradation and observed over the lifetime of the device. The way in which the selected indicator or indicators of degradation, e.g., operational parameters of the device, degrade or change over time from a reference level can be used as a measure of degradation. The measure of degradation can refer to a particular indicator of degradation, e.g., operational parameter, or a plurality of such indicators of degradation. In an embodiment, the measure of degradation can specify an amount by which one or more of the indicators of degradation has changed compared to a reference level for each respective indicator of degradation used in determining the measure of degradation.

One example of an operational parameter of a device that can be used as an indicator of degradation that can be observed over time can include drain saturation current commonly denoted as $I_{dsat}$. Degradation of a device, as measured in the change in $I_{dsat}$ of the device, is observable in the form of decreasing $I_{dsat}$ compared to a reference level of $I_{dsat}$ over the lifetime of the device. Another example of an operational parameter of a device that can be used as an indicator of degradation that can be observed over time can include threshold voltage commonly denoted as $V_t$. Degradation of a device, as measured in change in $V_t$ of the device, is observable in the form of increasing $V_t$ compared to a reference level of $V_t$ over the lifetime of the device.

Thus, one or more of the operational parameters can be used as, or used to formulate, a measure of degradation of a device by determining the amount by which that operational parameter, or collection of operational parameters, changes over time compared to a selected reference level for each operational parameter used. The reference level can be a specification requirement, the initial value of the operational parameter at the start or beginning of the lifetime of the device, e.g., pre-degradation, or the like.

From the collected degradation data, the amount of time for the device to degrade a selected amount can be determined. For example, the amount of time for a selected operational parameter to deviate from a predetermined amount or percentage from the reference level for that operational parameter can be determined. Additional time periods over which the device degrades by the same amount or percentage from the reference level also can be identified. For example, the times when the device degrades by 10%, 20%, 30%, etc. from the reference level can be identified. Referring again to FIG. 2, counter 210 can be used to determine when the noted time periods expire, thereby indicating that multi-fingered device 105 is expected to have degraded by the particular amount that is correlated with the amount of time determined to have passed.

As shown, counter 210 can receive a reference clock signal 215 having a known frequency. Counter 210 can be configured to count clock edges, clock cycles, or the like. Further, counter 210 can store one or more predetermined counts as degradation threshold(s). Each degradation threshold can represent an amount of time required for multi-fingered device 105 to degrade by a predetermined amount for one or more given degradation indicators. For purposes of illustration, consider each count to correspond to an amount of time necessary for multi-fingered device 105 to degrade 10% from the reference level. For example, when $I_{dsat}$ is used as the degradation indicator, each count represents an amount of time necessary for $I_{dsat}$ of multi-fingered device 105 to decrease by 10% from the reference level of $I_{dsat}$. When $V_t$ is used as the degradation indicator, each count can represent an amount of time necessary for $V_t$ of multi-fingered device 105 to increase by 10% from the reference level of $V_t$.

Accordingly, counter 210 can count selected edges of reference clock signal 215. The value of counter 210 can be referred to as the count. Counter 210 can determine when the count reaches or exceeds each degradation threshold and signal control circuit 205. For example, counter 210 can include one or more comparators configured to compare the count with the degradation threshold or thresholds stored within counter 210. Each time counter 210 determines that a degradation threshold is reached by the count, counter 210 can signal control circuit 205.

Responsive to each signal or notification received from counter 210, control circuit 205 can close one or more of switches 110-120, thereby activating one or more of fingers 2-4. Activation of additional fingers in this manner counteracts degradation in operational parameters such as $I_{dsat}$ and/or $V_t$, thereby returning the operational parameter or parameters at or about the reference level of each respective operational parameter prior to the occurrence of degradation.

In an embodiment, a single degradation threshold can be stored. In that case, the counter can be reset each time that the count reaches the degradation threshold. In another embodiment, multiple and different degradation thresholds are stored. For example, first, second, and third degradation thresholds can be stored, where the first, second, and third degradation thresholds are different. Finger 2, for example, can be activated when the first degradation threshold is reached. Finger 3 can be activated when the second degradation threshold his reached. Finger 4 can be activated when the third degradation threshold is reached.

When using time to determine when to activate secondary fingers of multi-fingered device 105, it should be appreciated that the particular environment in which the IC that includes multi-fingered device 105 operates and device-specific factors can influence the degradation rate. The environment can be characterized by one or more factors also referred to as stressors. In general, the amount of time that multi-fingered device 105 is active, e.g., at least one finger is active, and therefore exposed to the stressors of a particular environment can be measured to determine lifetime of multi-fingered device 105 and determine the degradation rate of one or more operational parameters of multi-fingered device 105. Multi-fingered device 105 is considered active while at least finger 1 is active. Accordingly, to be active, gate region 140A is coupled to the gate circuit node and the IC is operational in that power is applied to the IC and finger 1.

Examples of stressors can include, but are not limited to, ambient temperature, time spent by multi-fingered device 105 in different operating states, frequency of operation and/or switching, etc. The values of these stressors characterize the environment and influence the degradation rate of multi-fingered device 105. For example, multi-fingered device 105 will degrade more rapidly when active and operating in an environment having a higher ambient temperature than in an environment having a lower ambient temperature. The amount of time that multi-fingered device 105 is maintained in particular operating states, e.g., having a particular bias, can increase or decrease the degradation rate. The frequency at which multi-fingered device 105 switches state within a circuit, e.g., frequency of operation, can increase or decrease the degradation rate. While still part of the environment of multi-fingered device 105, it should be appreciated that the amount of time multi-fingered device 105 is maintained in a particular state and/or the frequency at which multi-fingered device switches state is dependent upon the particular circuit and application in which multi-fingered device 105 is located.

Device specific factors that can alter the degradation rate of a device can include, but are not limited to, the process technology used to manufacture the device, and thus, the size of the device (e.g., gate length) and the supply voltage of the device and/or IC.

Accordingly, in an embodiment, when the particular environment in which the IC including multi-fingered device 105 is known and can be approximated or modeled, degradation data from which the various time periods, e.g., degradation thresholds, are determined can be obtained by subjecting multi-fingered device 105, or a test device substantially similar to, or the same as, multi-fingered device 105, to the same or substantially similar stressors that characterize that environment. In this manner, the data used to determine the various degradation thresholds more accurately reflects and tracks the "real-world" usage of multi-fingered device 105 when operating in the field.

Figure 3:
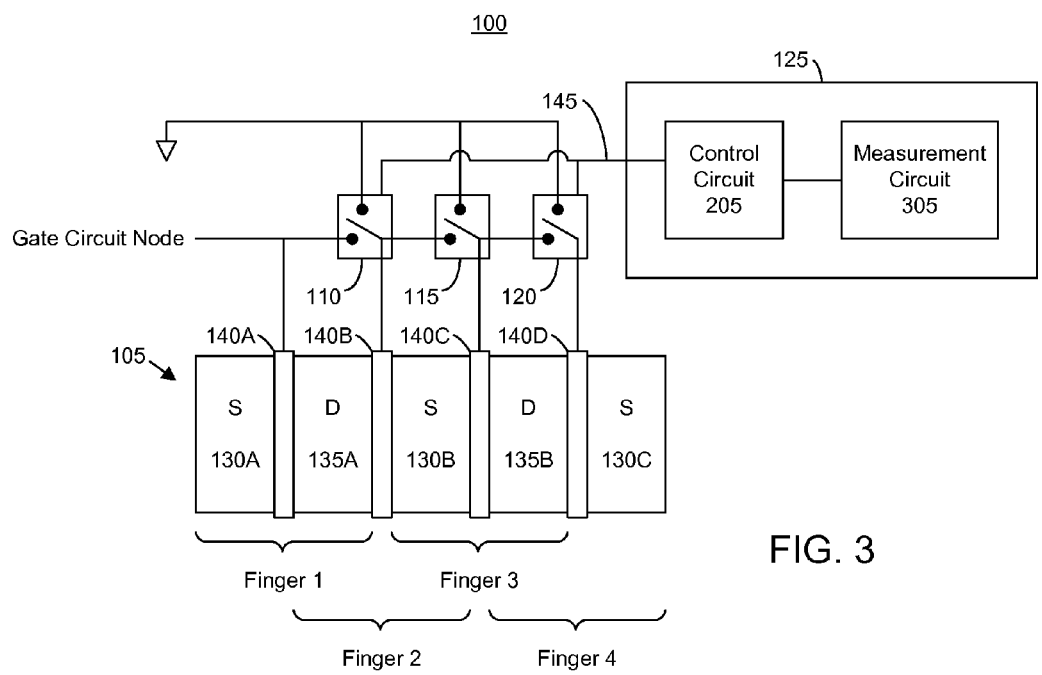
FIG. 3 is a third block diagram illustrating the system of FIG. 1 in accordance with another embodiment disclosed within this specification.

FIG. 3 is a third block diagram illustrating the system of FIG. 1 in accordance with another embodiment disclosed within this specification. FIG. 3 illustrates an embodiment in which the actual degradation indicator of multi-fingered device 105 used to determine the measure of degradation is measured while multi-fingered device 105 is operating in the field. As noted with respect to FIG. 2, for purposes of clarity and ease of illustration, the source circuit node, the drain circuit node, and the wires coupling multi-fingered device 105 to the source and drain circuit nodes are not shown. FIG. 3 illustrates multi-fingered device 105, switches 110-120, and finger activation circuit 125.

Finger activation circuit 125 includes control circuit 205 and a measurement circuit 305. Any of a variety of different measurement circuits or systems can be used to obtain real-time readings or samples of the degradation indicators discussed within this specification. One example of a measurement circuit that can be used is discussed in Keane, et al., "An On-Chip NBTI Sensor for Measuring pMOS Threshold Voltage Degradation," IEEE Transactions on Very Large Scale Integration (VLSI) Systems, 2008. The example provided, however, is not intended to be limiting as other known types of measurement circuits can be used to obtain real-time measurements for $I_{dsat}$ and/or $V_t$ in the field and on or within the same IC as multi-fingered device 105.

FIG. 3 illustrates an embodiment that operates substantially as described within this specification except that real-time measurements of operational parameters of multi-fingered device 105 are taken and compared with reference levels. Measurement circuit 305, for example, can be configured to measure $I_{dsat}$, $V_t$, or both $I_{dsat}$ and $V_t$. Measurement circuit 305 can be configured to store one or more degradation thresholds, wherein each degradation threshold specifies a level of one of the degradation indicators. Thus, whereas the degradation threshold specified time in FIG. 2, the degradation threshold specifies $I_{dsat}$, $V_t$, or both in FIG. 3.

Accordingly, measurement circuit 305 can be configured to compare a real-time measurement of one of the degradation indicators with a stored degradation threshold corresponding to the measured degradation threshold. Measurement circuit 305 further can determine when the degradation indicators reaches a degradation threshold. For example, measurement circuit 305 can include one or more comparators configured to compare measurements of degradation indicators to corresponding degradation thresholds.

Each time measurement circuit 305 determines that a degradation threshold is crossed, e.g., a selected operational parameter is found to have degraded by a minimum amount from the reference level, measurement circuit 305 can provide a signal or indication to control circuit 205. Responsive to the signal or notification from measurement circuit 305, control circuit 205 can close one or more of switches 110-

120, thereby activating one or more of fingers 204. As a consequence of activating one or more of fingers 2-4, the degraded operational parameter can be brought back at or about the reference level.

The embodiment illustrated in FIG. 3 can counteract degradations relating to $I_{dsat}$ and $V_t$ without having prior knowledge of the particular operating environment in which multi-fingered device 105 will operate. In this regard, the embodiment in FIG. 3 can be considered to be more dynamic than the embodiment illustrated in FIG. 2 as measurement of operational properties in real-time allows finger activation circuit 125 to adapt to changing, unknown, or unanticipated environmental conditions.

It should be appreciated that the number of fingers used in a multi-fingered device configured as described with reference to FIGS. 1-3 is not limited to four. Multi-fingered devices with fewer or more fingers can be used in combination with fewer or more switches as the case may be. Further, multi-fingered device 105 is shown within FIGS. 1-3 to have fingers of substantially equivalent strength, though this need not be the case. For example, the sizing of each of the secondary fingers, e.g., those fingers that initially are not active, can differ from one another and from the sizing of the primary fingers. Sizing of primary fingers can be determined based upon design requirements for the multi-fingered device with reference to the particular circuit in which the multi-fingered device is to operate. Sizing of secondary fingers of the device can be correlated with the amount of degradation that is to be counteracted over a selected time period.

For example, if each time the device degrades by 10% from the reference level, one or more secondary fingers are to be activated to counteract the 10% degradation, the secondary fingers can be sized so that activating a particular number of secondary fingers "N," where N is an integer that is greater than or equal to one, brings the degradation indicator, e.g., $I_{dsat}$ or $V_t$, back to the reference level. As noted, N can be selected to be one, two, three, four, or more fingers.

Further, a multi-fingered device can have one or more, e.g., two, three or more, primary fingers. Consider a multi-fingered device having ten primary fingers, where each primary finger is responsible for contributing 10 units of $I_{dsat}$ so that total $I_{dsat}$ of the multi-fingered device is approximately 100 units. In this example, 100 units of $I_{dsat}$ corresponds to the reference level where no degradation has occurred. After two years of operation, the multi-fingered device can degrade to provide only 70 units of $I_{dsat}$ corresponding to a 30% degradation from the reference level. After five years of operation, the multi-fingered device can degrade further to provide only 50 units of $I_{dsat}$ corresponding to a 50% degradation from the reference level. After 10 years of operation, the multi-fingered device can degrade further to provide only 30 units of $I_{dsat}$ corresponding to a 70% degradation from the reference level.

By adding seven secondary fingers with substantially the same sizing as each of the primary fingers, the seven secondary fingers of the device can be activated over time to counteract up to 10 years of degradation. For example, each time the $I_{dsat}$, e.g., the measure of degradation in this example, is determined to have decreased by 10 units, which corresponds to the degradation threshold, a secondary finger can be activated to return $I_{dsat}$ to the reference level, e.g., increment $I_{dsat}$ by 10 units. This can continue until each of the seven secondary fingers is activated, thereby counteracting up to 10 years of degradation in the multi-fingered device.

The systems illustrated with reference to FIGS. 1-3 can be configured to add one or more secondary fingers responsive to the multi-fingered device suffering a first amount of degradation from the reference level. The system can subsequently add one or more secondary fingers responsive to the multi-fingered device suffering a second amount of degradation from the reference level that can be different than the first amount of degradation. The secondary fingers added can differ in number based upon the amount of degradation to be counteracted and the sizing of the secondary fingers.

In another embodiment, the number of fingers activated responsive to reaching each degradation threshold can vary. For example, responsive to reaching a degradation threshold, e.g., a first degradation threshold, a first number of secondary fingers can be activated. Responsive to reaching another degradation threshold, e.g., a second degradation threshold, a second number of secondary fingers that is different from the first number can be activated.

Figure 4:
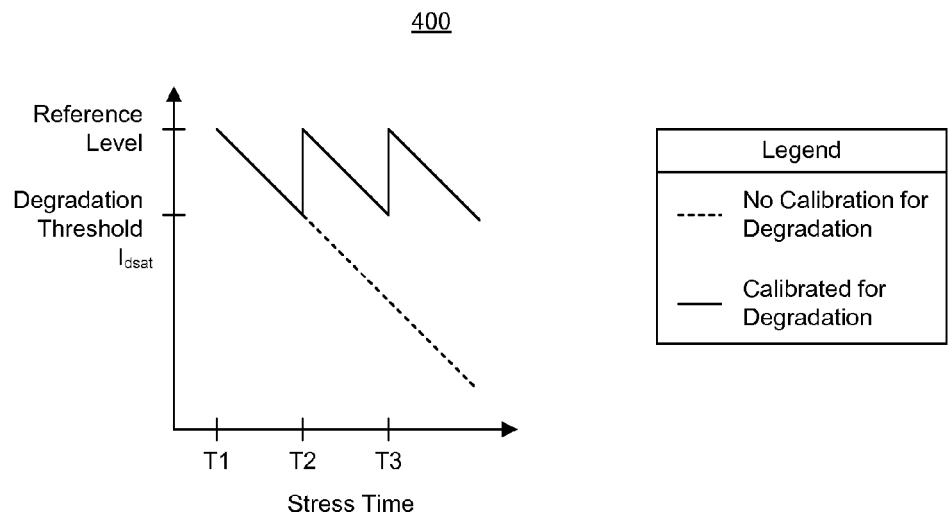
FIG. 4 is a first graph illustrating calibration of a multi-fingered device in accordance with another embodiment disclosed within this specification.

FIG. 4 is a first graph 400 illustrating calibration of a multi-fingered device in accordance with another embodiment disclosed within this specification. More particularly, FIG. 4 illustrates how $I_{dsat}$ of a device can degrade over time. The dotted line illustrates how $I_{dsat}$ decreases over time as the device is exposed to particular stressors as described within this specification. When no calibration is applied, $I_{dsat}$ continues to decline over time until the device eventually fails.

At time T1, the primary fingers of the multi-fingered device are active. The secondary fingers used for calibration are not active. At time T1, the level of $I_{dsat}$ is at the reference level. Over time, the level of $I_{dsat}$ in the device declines showing degradation. At time T2, the level of $I_{dsat}$ reaches a degradation threshold, whether actually measured or estimated based upon elapsed time. Accordingly, at time T2 one or more secondary fingers are activated, thereby returning the level of $I_{dsat}$ in the multi-fingered device to the reference level. After time T2, the multi-fingered device continues to degrade with $I_{dsat}$ continuing to decline. At time T3, the degradation threshold is reached again and one or more additional secondary fingers are activated to increase $I_{dsat}$ to the reference level.

In some cases, $I_{dsat}$ can degrade in a substantially linear fashion. Due to a variety of factors, for example, the multi-fingered device not being active at all times within a circuit, or not being active in a regular manner, $I_{dsat}$ can degrade in a non-linear fashion. In this regard, the x-axis (time), the y-axis ($I_{dsat}$), or both can be non-linear. For instance, the x-axis, the y-axis, or both can be specified in a logarithmic scale.

Figure 5:
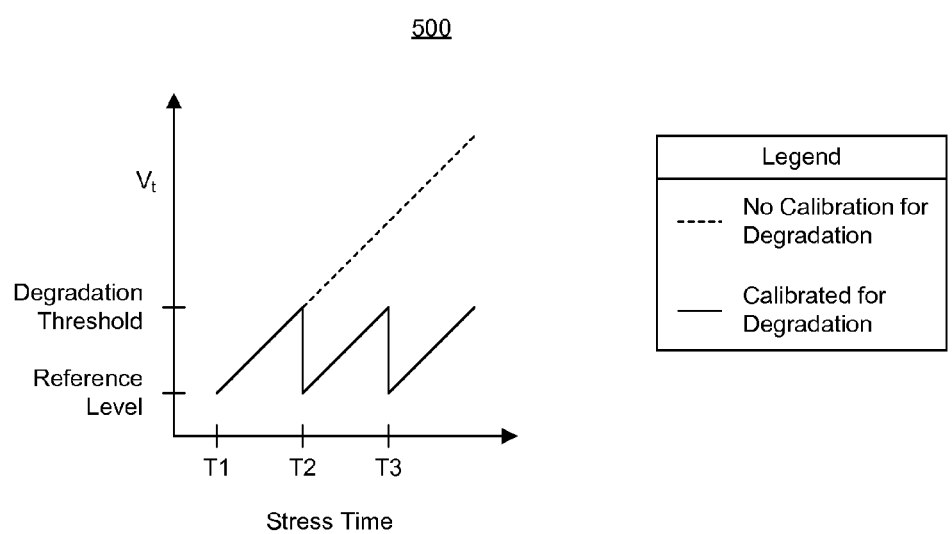
FIG. 5 is a second graph illustrating calibration of a multi-fingered device in accordance with another embodiment disclosed within this specification.

FIG. 5 is a second graph 500 illustrating calibration of a multi-fingered device in accordance with another embodiment disclosed within this specification. More particularly, FIG. 5 illustrates how $V_t$ of a device can degrade over time. The dotted line illustrates how $V_t$ increases over time as the device is exposed to particular stressors as described within this specification. When no calibration is applied, $V_t$ continues to increase over time until the device eventually fails.

At time T1, the primary fingers of the multi-fingered device are active. The secondary fingers used for calibration are not active. At time T1, the level of $V_t$ is at the reference level. Over time, the level of $V_t$ in the device increases showing degradation. At time T2, the level of $V_t$ reaches a degradation threshold, whether actually measured or estimated based upon time. Accordingly, at time T2 one or more secondary fingers are activated, thereby returning the level of $V_t$ in the multi-fingered device to the reference level. After time T2, the multi-fingered device continues to degrade with $V_t$ continuing to increase. At time T3, the degradation threshold is reached again and one or more additional secondary fingers are activated to decrease $V_t$ to the reference level.

As noted with regard to FIG. 4, in some cases, $V_t$ can degrade in a substantially linear fashion. In other cases, such as those already described within this specification, $V_t$ can degrade in a non-linear fashion. In this regard, the x-axis (time), the y-axis ($V_t$), or both can be non-linear. For instance, the x-axis, the y-axis, or both can be specified in a logarithmic scale.

FIG. 6 is a first flow chart illustrating a method 600 of collecting calibration data for a device within an IC in accordance with another embodiment disclosed within this specification. Method 600 can be implemented using an IC test system that is coupled to a data processing system. IC test systems are known in the art and can be communicatively linked with data processing systems, e.g., a computer system, that can collect, store, and manipulate data obtained from the IC during testing.

An example of a data processing system can include at least one processor coupled to memory elements through a system bus. The data processing system can store program code within the memory elements so that the processor can execute the program code accessed from the memory elements via the system bus. The memory elements can include one or more physical memory devices such as, for example, local memory and one or more bulk storage devices. Local memory can refer to random access memory or other non-persistent memory device(s) generally used during actual execution of the program code. Bulk storage devices can be implemented as a hard drive or other persistent data storage device. The data processing system also can include one or more cache memories that provide temporary storage of at least some program code in order to reduce the number of times program code must be retrieved from the bulk storage device during execution.

Input/output (I/O) devices such as a keyboard, a display, and a pointing device optionally can be coupled to the data processing system. The I/O devices can be coupled to the data processing system either directly or through intervening I/O controllers. Network adapters also can be coupled to the data processing system to enable the system to become coupled to other systems, computer systems, remote printers, and/or remote storage devices through intervening private or public networks. Modems, cable modems, and Ethernet cards are examples of different types of network adapters that can be used with the data processing system.

In step 605, a device, e.g., a multi-fingered device, within an IC can be subjected to a selected environment having known stressors. As noted, the environment can be characterized by the stressors such as the ambient temperature surrounding the IC and test system, the particular circuit design that is operating within the IC of which the device under test is a part, time spent by the device in particular states, frequency of operation and/or switching of the device under test, and the like. Further, aspects of the IC and device, e.g., device specific factors, can be known such as the sizing of the device and components or different regions of the device, the particular process technology used to implement the device and/or IC, etc. Information as described can be stored and/or associated with the degradation data that is obtained and/or collected.

In step 610, degradation indicators can be measured over time. For example, the IC can include one or more measurement circuits that are coupled to the device under test. The measurement circuits can measure $I_{dsat}$, $V_t$, or both $I_{dsat}$ and $V_t$ of the device under test over time as the device under test and the IC operate within the environment. The measurement circuits can be configured to output measured values of the degradation indicators via one or more pins of the IC to the data processing system.

In another example, external measurement equipment can be used to probe or otherwise couple with the IC to measure the degradation indicators over time and provide the measured values to the data processing system. It should be appreciated that time stamp information, whether determined from the internal clocking of the IC and output with the measured values of the degradation indicators or by another source external to the IC that is provided to the data processing system can be correlated with the measured values of the degradation indicators.

In step 615, the degradation data set can be stored. The degradation indicators can be provided to the data processing system for storage. For example, a record can be created and stored within the data processing system where each record can include a value of $V_t$ and/or $I_{dsat}$ along with a time stamp specifying when the value(s) were measured. The degradation data set can include a plurality of such records that span a selected time period. As noted, the degradation data set can be associated with the environment used for the test and the device specific parameters.

In step 620, degradation thresholds can be determined from the degradation data set. In step 625, the time stamp that is correlated to each degradation threshold can be identified. In step 630, the data processing system can translate the time stamps into counts based upon the known frequency of a reference clock that is to be used to measure time within a finger activation circuit as described within this specification based upon the start time of the test.

As discussed with reference to FIGS. 3 and 4, the amount of time for a device to degrade, whether in terms of $I_{dsat}$ or $V_t$, can be non-linear in nature. Thus, the amount of time and, thus, the counts serving as degradation thresholds may not be correlated on a linear scale.

In step 635, the count for each degradation threshold can be stored within a memory of the data processing system and used within a finger activation circuit of an IC that is to be released into the field.

It should be appreciated that method 600 also can be performed for a multi-fingered device where the degradation indicators can be observed as secondary fingers are activated over time to determine more accurate degradation thresholds.

FIG. 7 is a second flow chart illustrating a method 700 of calibrating a multi-fingered device in accordance with another embodiment disclosed within this specification. Method 700 can be performed by a system as described with reference to FIGS. 1-6 of this specification. Accordingly, method 700 can begin in step 705 where a multi-fingered device begins operating in an IC. The multi-fingered device can begin operation with a predetermined number of fingers, e.g., the primary fingers, being active. Secondary fingers, as noted, are fingers of the multi-fingered device that are initially deactivated and available to overcome degradation of the multi-fingered device over time.

In step 710, the finger activation circuit can determine and monitor one or more degradation indicators, e.g., a measure of degradation. In an embodiment in which time is used as a degradation indicator, the finger activation circuit can determine and monitor the count of a counter that is configured to count selected edges of a reference clock. In an embodiment in which real-time measurements of quantities such as $V_t$ and/or $I_{dsat}$ are used as degradation indicators, the measurements of those quantities taken from the multi-fingered device during operation can be determined and monitored.

In step 715, the finger activation circuit can determine whether the degradation indicator, or alternatively, a measure of degradation, meets the degradation threshold. For example, meeting the degradation threshold can include a count being equal to, or exceeding, a threshold count specified as a degradation threshold. Meeting the degradation threshold can include a degradation indicator such as $I_{dsat}$ being equal to, or greater than, a level of $I_{dsat}$ that is some predetermined amount greater than a reference level of $I_{dsat}$. Meeting the degradation threshold further can include a degradation indicator such as $V_t$ being less than, or equal to, a level of $V_t$ that is some predetermined amount less than a reference level of $V_t$.

Responsive to the finger activation circuit determining that the degradation indicator meets the degradation threshold, method 700 can proceed to step 720. Responsive to the finger activation circuit determining that the degradation indicator does not meet the degradation threshold, method 700 can loop back to step 710 to continue determining and monitoring one or more of the degradation indicators.

Continuing with step 720, the finger activation circuitry can activate "N" secondary fingers of the multi-fingered device. As noted, N can represent an integer value of one or more depending upon the manner in which secondary fingers of the multi-fingered device are designed and the amount of degradation to be overcome. Further, secondary fingers that are activated are those that are initially deactivated when the multi-fingered device begins operation within the IC.

The one or more embodiments disclosed within this specification allow a multi-fingered device to be continually calibrated over a selected time span. Additional fingers that are initially deactivated can be selectively activated over time to compensate for degradations that occur over the lifetime of the multi-fingered device. Calibration allows the multi-fingered device to be designed to closely match specified tolerances as opposed to being overdesigned and being less suited for the intended purposes of the multi-fingered device.

The flowcharts in the figures illustrate the architecture, functionality, and operation of possible implementations of systems, methods and computer program products according to one or more embodiments disclosed within this specification. In this regard, each block in the flowcharts can represent a module, segment, or portion of code, which includes one or more portions of executable program code that implements the specified logical function(s).

It should be noted that, in some alternative implementations, the functions noted in the blocks can occur out of the order noted in the figures. For example, two blocks shown in succession can, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system having memory and a processor, causes the system to perform at least a portion of the functions described within this specification. Examples of data storage media can include, but are not limited to, optical media, magnetic media, magneto-optical media, computer memory such as random access memory, bulk storage devices, e.g., hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of calibrating performance of a multi-fingered device within an integrated circuit (IC), the method comprising:
    determining a measure of degradation for the multi-fingered device within the IC, wherein a first finger of the multi-fingered device is active and a second finger of the multi-finger device is initially deactivated;
    comparing the measure of degradation with a degradation threshold; and
    responsive to determining that the measure of degradation meets the degradation threshold, activating the second finger of the multi-fingered device by coupling a gate of the second finger to a data signal also coupled to a gate of the first finger.

2. The method of claim 1, further comprising:
    selecting the measure of degradation to comprise an amount of time that the multi-fingered device is active; and
    selecting the degradation threshold to be a predetermined amount of time.

3. The method of claim 2, further comprising:
    determining the amount of time that the multi-fingered device is active according to a number of clock cycles counted within a counter implemented within the integrated circuit, wherein the number of clock cycles is compared with a threshold number of clock cycles representing the predetermined amount of time of the degradation threshold.

4. The method of claim 1, further comprising:
selecting the measure of degradation to comprise threshold voltage of the multi-fingered device; and
selecting the degradation threshold to be a level of threshold voltage of the multi-fingered device that is greater than a reference level of threshold voltage.

5. The method of claim 1, further comprising:
selecting the measure of degradation to comprise drain saturation current of the multi-fingered device; and
selecting the measure of degradation to comprise a level of drain saturation current of the multi-fingered device that is less than a reference level of drain saturation current.

6. The method of claim 1, wherein activating a finger of the multi-fingered device further comprises activating a plurality of fingers of the multi-fingered device.

7. A multi-fingered device for implementation within an integrated circuit, the multi-fingered device comprising:
a first finger configured to remain active;
a second finger that is initially deactivated concurrent with the first finger being active,
wherein the second finger is configured for activation during operation of the integrated circuit; and
a switch coupled to the second finger, wherein the switch selectively couples a gate of the second finger to a data signal also coupled to a gate of the first finger.

8. The multi-fingered device of claim 7, further comprising:
a finger activation circuit configured selectively activate the second finger of the multi-fingered device responsive to detecting a minimum degradation in the multi-fingered device,
wherein the second finger is initially deactivated and is activated responsive to detecting the minimum degradation of the multi-fingered device.

9. The multi-fingered device of claim 8, wherein the finger activation circuit comprises:
a control circuit configured to provide a control signal to the switch responsive to detecting the minimum degradation.

10. The multi-fingered device of claim 9, wherein the finger activation circuit further comprises:
a monitor circuit configured to detect the minimum degradation by determining an amount of time that the first finger of the multi-fingered device is active.

11. The multi-fingered device of claim 10, wherein the monitor circuit is configured to compare a count of a number of clock cycles that the first finger of the multi-fingered device is active to a degradation threshold, and, responsive to the count being greater than or equal to the degradation threshold, instruct the control circuit to activate the second finger.

12. The multi-fingered device of claim 9, wherein the finger activation circuit further comprises:
a monitor circuit configured to detect the minimum degradation by measuring an operational parameter of the multi-fingered device in the field, compare the operational parameter to a degradation threshold, and, responsive to determining that the operational parameter meets the degradation threshold, instruct the control circuit to activate the second finger.

13. The multi-fingered device of claim 12, wherein the operational parameter is a threshold voltage of the multi-fingered device and the degradation threshold specifies a level of threshold voltage that is greater than a reference level of threshold voltage.

14. The multi-fingered device of claim 12, wherein the operational parameter is a drain saturation current of the multi-fingered device and the degradation threshold specifies a level of drain saturation current that is less than a reference level of drain saturation current.

15. The multi-fingered device of claim 9, wherein a gate of the second finger is coupled to a supply voltage potential of the integrated circuit when not active.

16. A system configured for implementation within an integrated circuit, the system comprising:
a multi-fingered device comprising a first finger configured to remain active and a second finger initially configured to be inactive concurrent with the first finger being active;
a switch coupled to a gate of the second finger, wherein the switch is configured to activate the second finger by coupling a gate of the second finger to a signal also coupled to a gate of the first finger and deactivate the second finger by decoupling the gate of the second finger from the signal; and
a finger activation circuit configured to instruct the switch to activate the second finger responsive to detecting a minimum amount of degradation in the device.

17. The system of claim 16, wherein the switch couples the gate of the second finger to a supply voltage of the integrated circuit when not active.

18. The system of claim 17, wherein the finger activation circuit comprises:
a control circuit coupled to the switch, wherein the control circuit is configured to provide a control signal to the switch; and
a monitor circuit configured to detect the minimum degradation in the device and, in response, signal the control circuit.

* * * * *